(12) United States Patent
Tsubouchi

(10) Patent No.: US 12,082,340 B2
(45) Date of Patent: Sep. 3, 2024

(54) SEMICONDUCTOR DEVICE AND MEMORY SYSTEM

(71) Applicant: KIOXIA CORPORATION, Tokyo (JP)

(72) Inventor: Yuta Tsubouchi, Tokyo (JP)

(73) Assignee: Kioxia Corporation, Tokyo (JP)

( * ) Notice: Subject to any disclaimer, the term of this patent is extended or adjusted under 35 U.S.C. 154(b) by 232 days.

(21) Appl. No.: 17/685,853

(22) Filed: Mar. 3, 2022

(65) Prior Publication Data

US 2023/0090795 A1    Mar. 23, 2023

(30) Foreign Application Priority Data

Sep. 22, 2021 (JP) ................. 2021-154443

(51) Int. Cl.
*H05K 1/18* (2006.01)
*H01L 25/065* (2023.01)

(52) U.S. Cl.
CPC .......... *H05K 1/181* (2013.01); *H01L 25/0652* (2013.01); *H01L 25/0655* (2013.01); *H05K 2201/09418* (2013.01); *H05K 2201/09427* (2013.01); *H05K 2201/10159* (2013.01); *H05K 2201/10522* (2013.01); *H05K 2201/10545* (2013.01)

(58) Field of Classification Search
CPC ............. H05K 1/18; H05K 1/181; H05K 2201/09418; H05K 2201/09427; H05K 2201/10159; H05K 2201/10522; H05K 2201/10545; H05K 2201/10189; G11C 5/02–06; G11C 5/025; G11C 5/063; H01L 23/50

USPC ........... 361/764–785, 792–795, 803; 710/305–317

See application file for complete search history.

(56) References Cited

U.S. PATENT DOCUMENTS

| | | | | |
|---|---|---|---|---|
| 6,016,256 A | * | 1/2000 | Crane, Jr. | ........... H01L 23/5385 361/813 |
| 7,161,820 B2 | * | 1/2007 | Funaba | ................ G11C 7/1048 361/728 |
| 7,791,175 B2 | | 9/2010 | Pyeon | |
| 8,856,482 B2 | | 10/2014 | Grunzke | |
| 8,861,215 B2 | | 10/2014 | Nomoto et al. | |
| 9,035,450 B2 | * | 5/2015 | Kariyazaki | ......... H01L 23/5222 361/811 |

(Continued)

FOREIGN PATENT DOCUMENTS

| | | |
|---|---|---|
| JP | 2012009601 A | 1/2012 |
| JP | 5633885 B2 | 12/2014 |

(Continued)

*Primary Examiner* — Tuan T Dinh
(74) *Attorney, Agent, or Firm* — Kim & Stewart LLP

(57) ABSTRACT

According to one embodiment, a semiconductor device includes receiving terminals on a surface of a substrate to receive first signals and transmitting terminals on the surface of the substrate to transmit second signals. The transmitting terminals are symmetrically positioned on the surface of the substrate with respect to the receiving terminals at a substantially 90 degree rotation about a rotation center position. The ordering of the transmitting terminals along the surface of the substrate from the rotation center position matches the ordering of the receiving terminals along the surface of the substrate from the rotation center position.

18 Claims, 7 Drawing Sheets

(56) References Cited

U.S. PATENT DOCUMENTS

| | | | |
|---|---|---|---|
| 9,159,647 B2 | 10/2015 | Choi | |
| 2008/0094811 A1* | 4/2008 | Hazelzet | G11C 5/04 |
| | | | 361/760 |
| 2008/0116572 A1 | 5/2008 | Baek | |
| 2009/0020855 A1 | 1/2009 | Pyeon | |
| 2009/0243649 A1 | 10/2009 | Pax | |
| 2010/0297812 A1 | 11/2010 | Pyeon | |
| 2015/0371698 A1* | 12/2015 | Mizuno | G06F 13/16 |
| | | | 365/51 |
| 2016/0035656 A1 | 2/2016 | Haba | |
| 2016/0049176 A1* | 2/2016 | Lee | G11C 5/063 |
| | | | 365/51 |
| 2016/0093340 A1* | 3/2016 | Sun | H01L 24/00 |
| | | | 365/51 |
| 2019/0051587 A1* | 2/2019 | Azeroual | H01L 21/4857 |

FOREIGN PATENT DOCUMENTS

| | | |
|---|---|---|
| JP | 5978332 B2 | 8/2016 |
| TW | 201448167 A | 12/2014 |

* cited by examiner

SEMICONDUCTOR DEVICE AND MEMORY SYSTEM

CROSS-REFERENCE TO RELATED APPLICATION(S)

This application is based upon and claims the benefit of priority from Japanese Patent Application No. 2021-154443, filed Sep. 22, 2021, the entire contents of which are incorporated herein by reference.

FIELD

Embodiments described herein relate generally to a semiconductor device and a memory system.

BACKGROUND

Memory systems of certain types comprise electronic components mounted on a printed circuit board. In such memory systems, several communication chips or other electronic components are often interconnected as a ring daisy chain. Longer interconnections by a ring daisy chain generally causes an increase in power consumption and a reduction in a communication rate.

DETAILED DESCRIPTION

In general, according to one embodiment, a semiconductor device includes a plurality of receiving terminals on a surface of a substrate. The receiving terminals are configured to receive first signals. A plurality of transmitting terminals is on the surface of the substrate. The transmitting terminals are configured to transmit second signals. The plurality of transmitting terminals are symmetrically positioned on the surface of the substrate with respect to the plurality of receiving terminals at a substantially 90 degree rotation about a rotation center position. An ordering of the plurality of transmitting terminals along the surface of the substrate from the rotation center position matches an ordering of the plurality of receiving terminals along the surface of the substrate from the rotation center position.

Certain example embodiments will be described hereinafter with reference to the drawings.

First Embodiment

Figure 1:
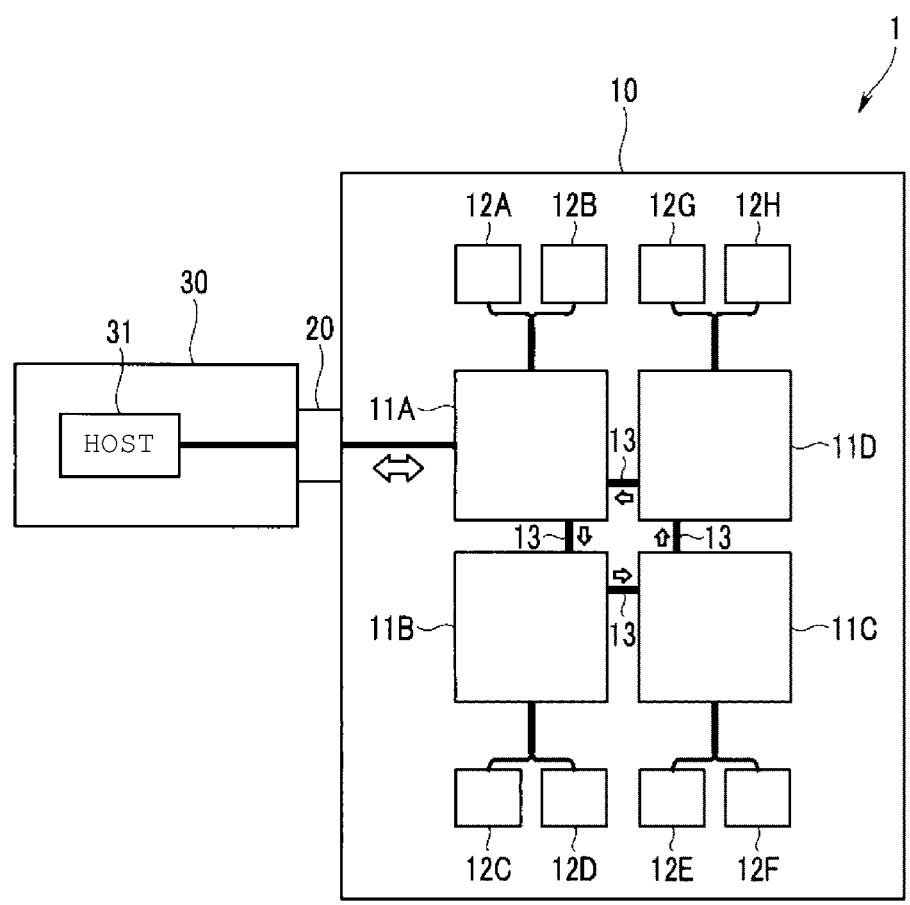
FIG. 1 is a block diagram of a memory system according to a first embodiment.

FIG. 1 is a block diagram illustrating a configuration of a memory system according to a first embodiment. As illustrated in FIG. 1, a memory system 1 includes a plurality of communication chips 11 (four communication chips 11A to 11D) and a plurality of memory devices 12 (eight memory devices 12A to 12H) that are mounted on a memory module board 10. The memory module board 10 is a printed circuit board in this example. The communication chips 11A to 11D are semiconductor devices connected by a ring daisy chain 13. The memory system 1 is a semiconductor device formed on one substrate (e.g., printed circuit board, device card, etc.) and used in, for example, a memory card such as an SD card, an SSD (Solid State Drive), or a main memory of a computer-type device.

The memory system 1 is connected to a host 31 (on a mother board 30) via a connection section 20. The connection section 20 is configured to connect the memory system 1 to the mother board 30 and is implemented by, for example, a socket, a card edge connector, or a jumper cable. The host 31 is, for example, an electronic circuit device such as a processor, an ASIC (Application Specific Integrated Circuit) or an FPGA (Field Programmable Gate Array), or an electronic device incorporating such a processor or the like.

The communication chip 11A is connected to the memory devices 12A and 12B. Likewise, the communication chip 11B is connected to the memory devices 12C and 12D, the communication chip 11C is connected to the memory devices 12E and 12F, and the communication chip 11D is connected to the memory devices 12G and 12H.

Of the communication chips 11A to 11D, at least the communication chip 11A includes an interface circuit for communicating with the host 31 via the connection section 20. The host 31 may be an external host device in some instances. Each of the communication chips 11A to 11D has functions as a bridge device (bridge communication connection) and a memory controller. Each of the communication chips 11A to 11D is able to access any of the connected memory devices 12A to 12H in response to a request received from the host 31.

The communication chips 11A to 11D are each directly connected to two of the memory devices 12. It is noted that the disclosure is not limited to this example, and the communication chips 11A to 11D may be each connected to just one memory device 12 or three or more memory devices 12. The communication chips 11A to 11D are each connected to at least one memory device 12.

The memory devices 12A to 12H are, for example, NAND flash memories. The memory devices 12A to 12H may be other type semiconductor memories. For example, SRAM, DRAM, MRAM, or PRAM may be used the memory devices 12A to 12H.

Figure 2:
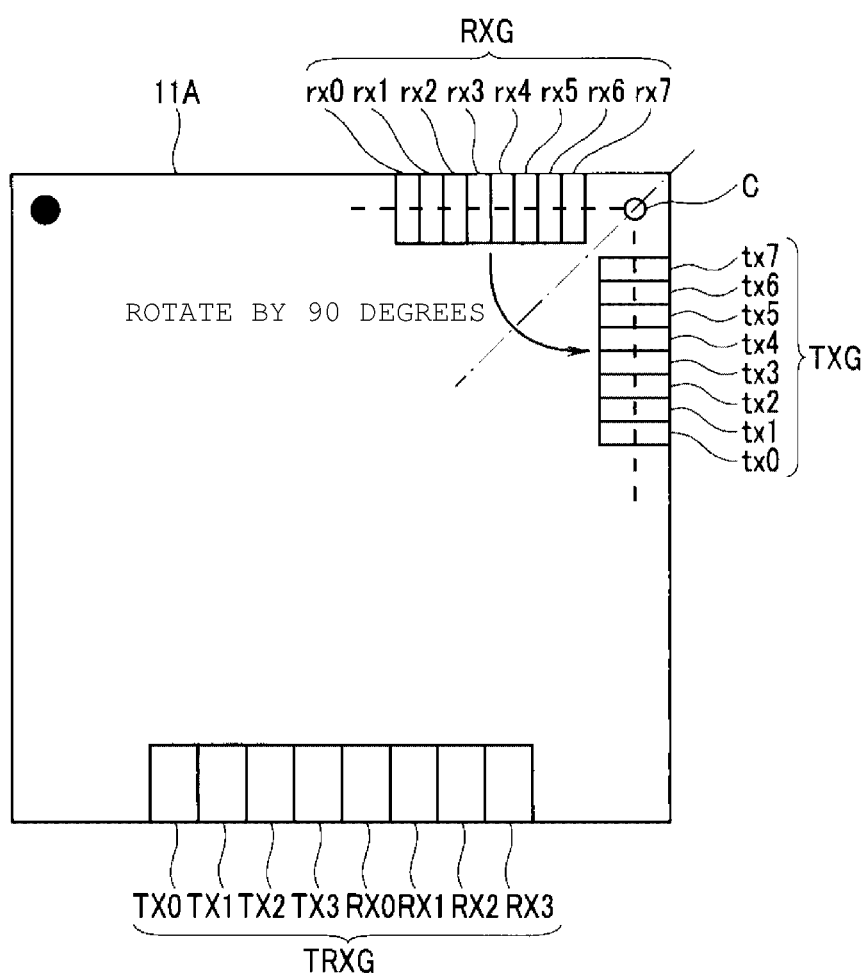
FIG. 2 depicts aspects of a communication chip according to a first embodiment.

FIG. 2 is an explanatory diagram of an example of a communication chip 11 according to the first embodiment. The communication chip 11A will be described as representative of the communication chips 11A to 11D since each may have the same general configurations.

The communication chip 11A includes a receiving terminal group RXG for the daisy chain 13, a transmitting terminal group TXG for the daisy chain 13, and a transmitting/receiving terminal group TRXG for communication with the host 31.

The receiving terminal group RXG includes eight receiving terminals rx0 to rx7 disposed in an outermost edge portion on one side of the communication chip 11A. The plurality of receiving terminals rx0 to rx7 receive a first signal. In this example, the pairs of receiving terminals rx0 and rx1, rx2 and rx3, rx4 and rx5, and rx6 and rx7 are each a differential pair of terminals.

The transmitting terminal group TXG includes eight transmitting terminals tx0 to tx7 disposed in an outermost edge portion on another side of the communication chip 11A. The plurality of transmitting terminals tx0 to tx7 transmit a second signal that can be different from the first signal. The pairs of transmitting terminals tx0 and tx1, tx2 and tx3, tx4 and tx5, and tx6 and tx7 are each a differential pair of terminals. The side with the receiving terminal group RXG and the side with the transmitting terminal group TXG meet at a corner of the communication chip 11A.

The transmitting/receiving terminal group TRXG includes four transmitting terminals TX0 to TX3 and four receiving terminals RX0 to RX3 disposed in an outermost edge portion on a side opposite to the side on which the receiving terminal group RXG is disposed. The communication chip 11A communicates with the host 31 using four lanes (channels) for each of transmission and reception.

The receiving terminals rx0 to rx7 of the receiving terminal group RXG and the transmitting terminals tx0 to tx7 of the transmitting terminal group TXG are disposed in an order and a position relationship of rotation symmetry by 90 degrees with respect to each group about a rotation center position C that is virtually defined in the communication chip 11A. That is, the transmitting terminals tx0 to tx7 are disposed at positions such that rotating about the rotation center position C by 90 degrees would cause the transmitting terminals tx0 to tx7 to respectively overlap (or substantially so) the receiving terminals rx0 to rx7. The rotation center position C is a point on a straight line passing through centers of the receiving terminals rx0 to rx7 and near the corner portion of the communication chip 11A. The rotation center position C is a virtual point on a surface on which the receiving terminals rx0 to rx7 and the transmitting terminals tx0 to tx7 of the communication chip 11A are disposed. In the example of FIG. 2, the rotation center position C is provided on the communication chip 11A so that the transmitting terminals tx0 to tx7 are disposed in the outermost edge portion of the communication chip 11A. It is noted that when positions of the receiving terminal group RXG and those of the transmitting terminal group TXG are opposite from those illustrated in FIG. 2, a point on a straight line passing through centers of the transmitting terminals tx0 to tx7 and near the corner portion of the communication chip 11A is the rotation center position C.

In the present embodiment, arranging the receiving terminals rx0 to rx7 and the transmitting terminals tx0 to tx7 in the order and the position relationship of the rotation symmetry by 90 degrees makes it possible to optimize (ensure a shortest length, greatest linearity, and most equal length between different portions of) the daisy chain 13 on the memory module board 10.

While each of the receiving terminal group RXG, the transmitting terminal group TXG, and the transmitting/receiving terminal group TRXG includes eight terminals in this example, the number of terminals is not limited to eight and may be greater than or less than eight. The number of terminals in the receiving terminal group RXG, the transmitting terminal group TXG, and the transmitting/receiving terminal group TRXG corresponds to the number of lanes (channels) of each communication chip 11.

Furthermore, physical disposition of each of the receiving terminal group RXG, the transmitting terminal group TXG and the transmitting/receiving terminal group TRXG is not limited to that of FIG. 2 and other dispositions may be adopted. For example, the transmitting/receiving terminal group TRXG may be disposed in an outermost edge portion on a side opposed to the side on which the transmitting terminal group TXG is disposed.

It is noted that a shape of each of the receiving terminal group RXG, the transmitting terminal group TXG, and the transmitting/receiving terminal group TRXG is not necessarily a rectangle as illustrated in FIG. 2. The shape may be, for example, a circle, an oval, or a square. Moreover, it is often desirable that the terminals within each of the receiving terminal group RXG, the transmitting terminal group TXG, and the transmitting/receiving terminal group TRXG be apart from the other terminals.

Figure 3:
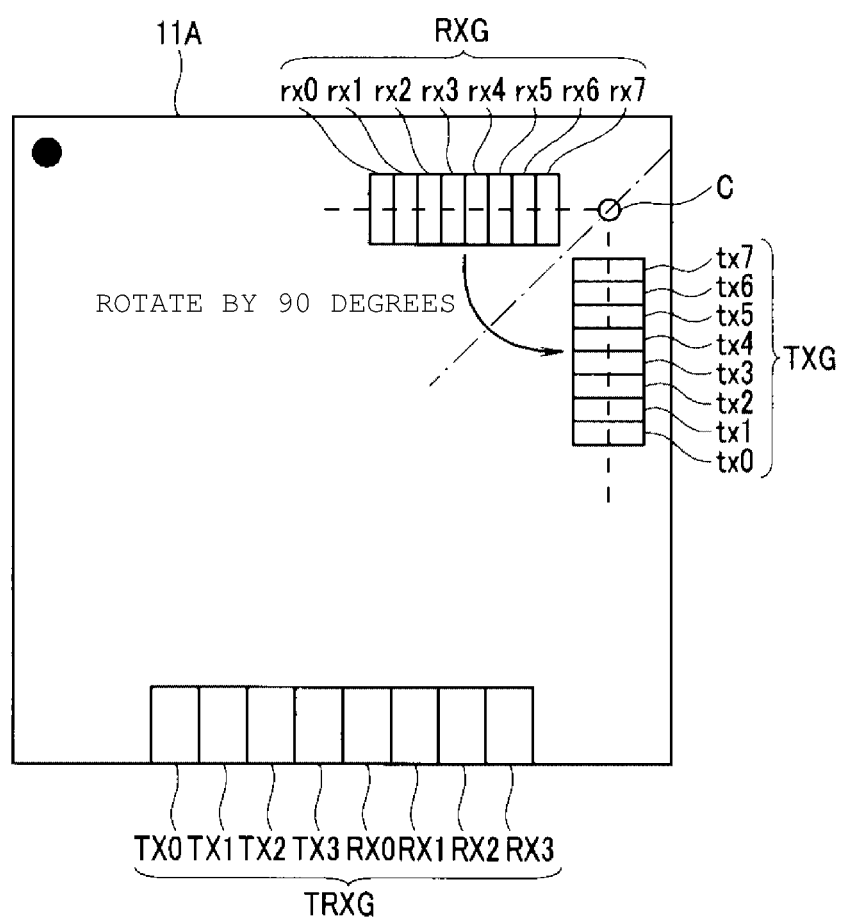
FIG. 3 depicts aspects of another communication chip according to a first embodiment.

While the receiving terminals rx0 to rx7 and the transmitting terminals tx0 to tx7 are disposed in the outermost edge portions of the communication chip 11A, the disposition is not limited to this, and the receiving terminals rx0 to rx7 and the transmitting terminals tx0 to tx7 may be disposed in other ways on the communication chip 11A, such as illustrated in FIG. 3.

FIG. 3 is an explanatory diagram illustrating another example of a communication chip 11 according to the first embodiment. As illustrated in FIG. 3, the receiving terminals rx0 to rx7 and the transmitting terminals tx0 to tx7 may be disposed at particular positions (offset from the outermost edge portions) of the communication chip 11A but still with the 90 degrees rotational symmetry with respect to each other about the rotation center position C. The rotation center position C is still a point on a straight line passing through centers of the receiving terminals rx0 to rx7 and is near the corner portion of the communication chip 11A, but not aligned to the corner as in FIG. 2.

Figure 4:
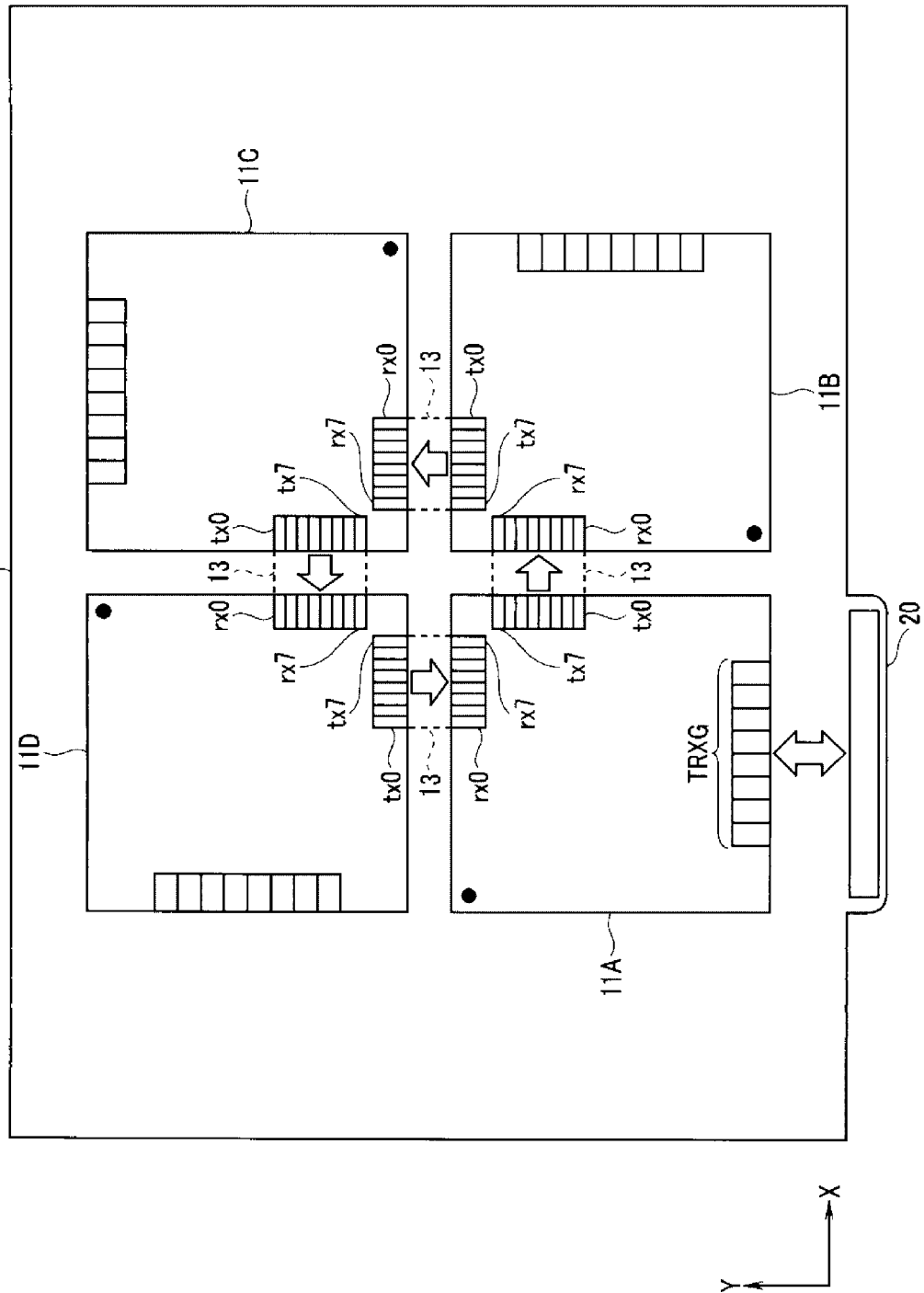
FIG. 4 illustrates an example of a disposition of four communication chips disposed on a memory module board according to a first embodiment.

FIG. 4 illustrates a specific example of disposition of four communication chips 11 disposed on a memory module board 10 according to the first embodiment.

As illustrated in FIG. 4, the communication chip 11A is disposed on the memory module board 10 so that the transmitting/receiving terminal group TRXG of the communication chip 11A is closest to the connection section 20. Specifically, the communication chip 11A is disposed at a position of an intersecting point between an X direction and a Y direction (intersecting point between an X-axis and a Y-axis) on the memory module board 10 of FIG. 4 so that the transmitting/receiving terminal group TRXG of the communication chip 11A are opposed to the connection section 20.

The communication chips 11B, 11C, and 11D are disposed counterclockwise from the communication chip 11A in this order. That is, in FIG. 4, the communication chip 11B is disposed at a position offset in the X direction from the communication chip 11A, the communication chip 11C is disposed at a position in offset the Y direction from the communication chip 11B, the communication chip 11D is disposed at a position offset in the −X direction from the communication chip 11C, and the communication chip 11A is disposed at a position offset in the −Y direction from the communication chip 11D.

The communication chip 11B is rotated by 90 degrees counterclockwise with respect to disposition of the communication chip 11A so that the transmitting terminals tx0 to tx7 of the communication chip 11A are opposed to the receiving terminals rx0 to rx7 of the communication chip 11B.

The communication chip 11C is rotated by 90 degrees counterclockwise with respect to disposition of the communication chip 11B so that the transmitting terminals tx0 to tx7 of the communication chip 11B are opposed to the receiving terminals rx0 to rx7 of the communication chip 11C.

The communication chip 11D is rotated by 90 degrees counterclockwise with respect to disposition of the communication chip 11C so that the transmitting terminals tx0 to tx7 of the communication chip 11C are opposed to the receiving terminals rx0 to rx7 of the communication chip 11D. The transmitting terminals tx0 to tx7 of the communication chip 11D are thereby facing the receiving terminals rx0 to rx7 of the communication chip 11A.

The memory system 1 of this example includes four communication chips 11 (11A to 11D) each including the receiving terminals rx0 to rx7 and the transmitting terminals tx0 to tx7. Each communication chip 11 according to the first embodiment includes the receiving terminals rx0 to rx7 and the transmitting terminals tx0 to tx7 that are disposed in the order and the position relationship of the rotation symmetry by 90 degrees with respect to each other about the virtual rotation center position C. Each communication chip 11 is disposed on the memory module board 10 so that the receiving terminals rx0 to rx7 thereof are facing the transmitting terminals tx0 to tx7 of an adjacent communication chip 11. Each communication chip 11 is disposed on the memory module board 10 so that the transmitting terminals tx0 to tx7 thereof are facing the receiving terminals rx0 to rx7 of another adjacent communication chip 11.

The memory system 1 can thereby ensure the smallest length, the highest linearity, and most equal length of connections in the ring daisy chain 13 connecting the communication chips 11A to 11D. As a result, the memory system 1 enables saving of power consumption of the memory module board 10 and an increase in a communication rate and/or stabilization of communication characteristics among the communication chips 11A to 11D.

Second Embodiment

Figure 5:
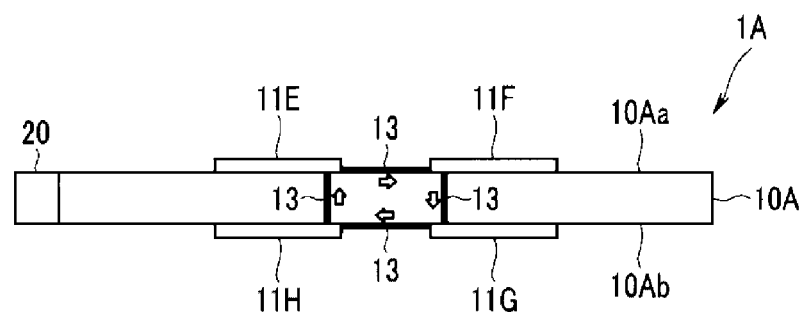
FIG. 5 is a side view of a memory system according to a second embodiment.

FIG. 5 is a side view illustrating configurations of a memory system according to the second embodiment. Memory system 1A illustrated in FIG. 5 has several components that are similar in configuration and function as those of memory system 1. Such similar components in the first and second embodiments are denoted by same reference symbols.

The memory system 1A includes four communication chips 11 (11E to 11H) that are mounted on a memory module board 10A, which can be a printed circuit board. The memory module board 10A has a front (upper) surface 10Aa and a back (lower) surface 10Ab. The communication chips 11E and 11F are mounted on the front surface 10Aa, and the communication chips 11G and 11H are mounted on the back surface 10Ab. The four communication chips 11E to 11H are mutually connected by a ring daisy chain 13.

Although not specifically illustrated in FIG. 5, the memory devices 12 (see FIG. 1) with which the communication chips 11E and 11F communicate are mounted on the front surface 10Aa, and the memory devices 12 with which the communication chips 11G and 11H communicate are mounted on the back surface 10Ab.

Figure 6:
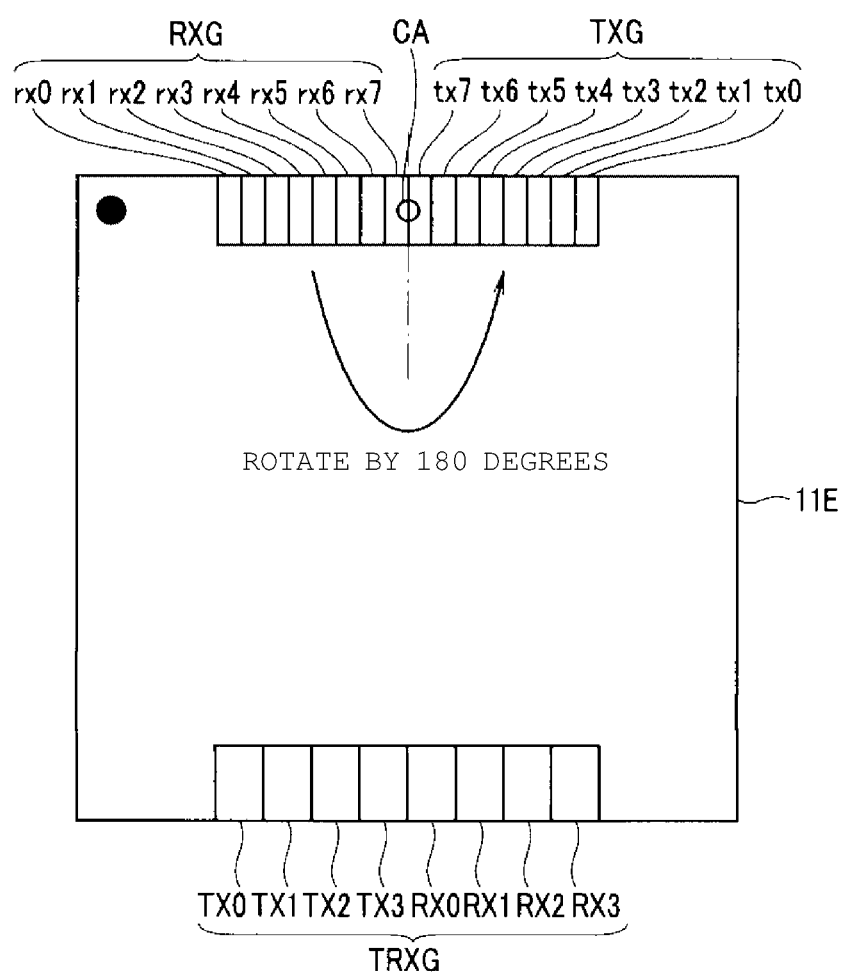
FIG. 6 depicts aspects of a communication chip according to a second embodiment.

FIG. 6 is an explanatory diagram of the communication chip 11 according to the second embodiment. The communication chip 11E will be described as representative of communication chips 11E to 11H since each may have the same general configuration.

The communication chip 11E includes a receiving terminal group RXG for the daisy chain 13, a transmitting terminal group TXG for the daisy chain 13, and a transmitting/receiving terminal group TRXG for communication with the host 31.

The receiving terminal group RXG includes eight receiving terminals rx0 to rx7 disposed in an outermost edge portion on one side of the communication chip 11E. The transmitting terminal group TXG includes eight transmitting terminals tx0 to tx7 disposed in an outermost edge portion on the same side with the receiving terminals rx0 to rx7. The transmitting/receiving terminal group TRXG includes four transmitting terminals TX0 to TX3 and four receiving terminals RX0 to RX3 disposed in an outermost edge portion on a side different from the one side of the communication chip 11E on which the receiving terminals rx0 to rx7 and transmitting terminals tx0 to tx7 are disposed. While depicted in FIG. 6 with the receiving terminal group RXG and the transmitting terminal group TXG disposed on a side opposite the transmitting/receiving terminal group TRXG, the receiving terminal group RXG and the transmitting terminal group TXG, in other examples, the transmitting/receiving terminal group TRXG need not be opposite the receiving terminal group RXG and the transmitting terminal group TXG.

The receiving terminals rx0 to rx7 of the receiving terminal group RXG and the transmitting terminals tx0 to tx7 of the transmitting terminal group TXG are disposed in an order and a position relationship with 180 degrees rotation symmetry with respect to each other about a rotation center position CA that is virtually defined in the communication chip 11E. That is, the transmitting terminals tx0 to tx7 are disposed at positions rotating about the rotation center position CA by 180 degrees with respect to the receiving terminals rx0 to rx7. The rotation center position CA is either a point on a straight line passing through centers of the receiving terminals rx0 to rx7 and near one side of the communication chip 11E, or a point on a straight line passing through centers of the transmitting terminals tx0 to tx7 and near the one side of the communication chip 11E. The rotation center position CA is a virtual point on a surface on which the receiving terminals rx0 to rx7 and the transmitting terminals tx0 to tx7 of the communication chip 11E are disposed.

Figure 7:
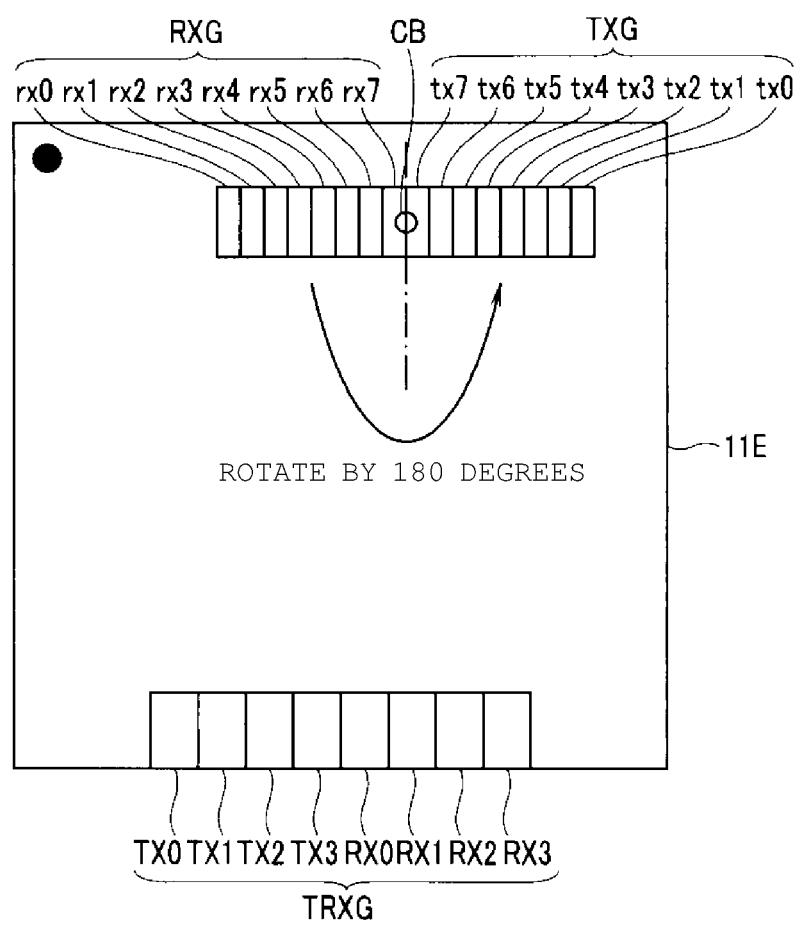
FIG. 7 depicts aspects of another communication chip according to a second embodiment.

While the receiving terminals rx0 to rx7 and the transmitting terminals tx0 to tx7 are disposed in the outermost edge portion of the communication chip 11E as illustrated in FIG. 6, the possible examples are not limited to this, and the receiving terminals rx0 to rx7 and the transmitting terminals tx0 to tx7 may be positioned on the communication chip in other ways, such as illustrated in FIG. 7, for example.

FIG. 7 depicts another example configuration of a communication chip 11 according to the second embodiment. As illustrated in FIG. 7, the receiving terminals rx0 to rx7 and the transmitting terminals tx0 to tx7 may be disposed at particular positions of the communication chip 11E with respect to each other about a rotation center position CB, which is not centered along an edge of the communication chip 11 and is furthermore offset from an outer edge towards the interior of the communication chip 11.

Figure 8:
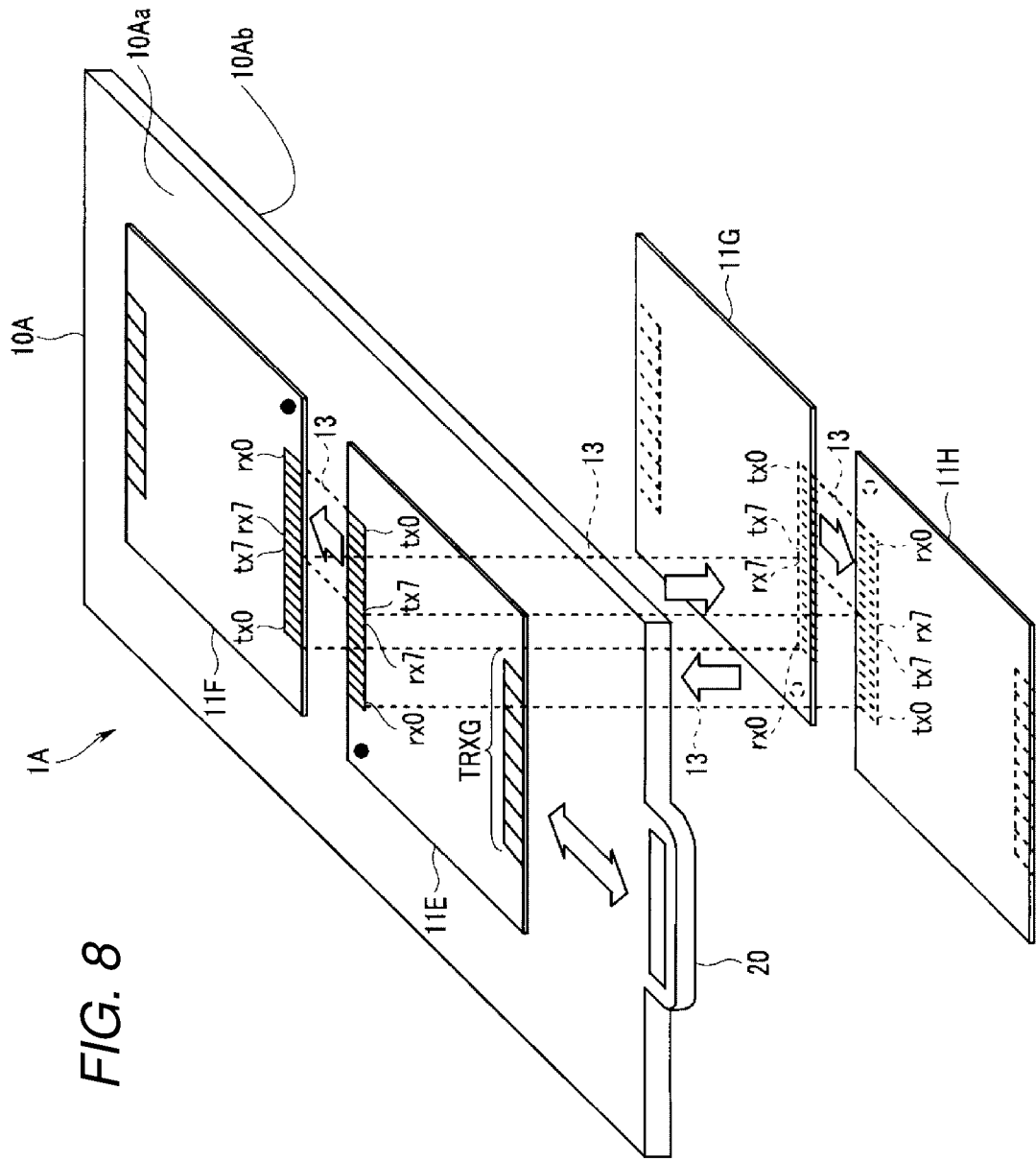
FIG. 8 is a perspective view illustrating a disposition of four communication chips disposed on a memory module board according to a second embodiment.

FIG. 8 is a perspective view illustrating disposition of four communication chips 11 disposed on the memory module board 10A according to the second embodiment. FIG. 8 is a partial exploded view. FIG. 8 illustrates that the communication chips 11G and 11H as taken off from the back surface 10Ab of the memory module board 10A, but this is for purposes of description only and the communication chips 11G and 11H are actually mounted on the back surface 10Ab.

The communication chip 11E is disposed on the front surface 10Aa so that the side on which the transmitting/ receiving terminal group TRXG of the communication chip 11E is disposed faces the connection section 20.

The communication chip 11F is disposed on the front surface 10Aa so that the receiving terminal group RXG and the transmitting terminal group TXG of the communication chip 11F face the transmitting terminal group TXG and the receiving terminal group RXG of the communication chip 11E.

The communication chip 11G is disposed on the back surface 10Ab so that the receiving terminal group RXG and the transmitting terminal group TXG of the communication chip 11G are opposed to the transmitting terminal group TXG and the receiving terminal group RXG of the communication chip 11F across the thickness of memory module board 10A.

The communication chip 11H is disposed on the back surface 10Ab so that the receiving terminal group RXG and the transmitting terminal group TXG of the communication chip 11H are opposed to the transmitting terminal group TXG and the receiving terminal group RXG of the communication chip 11G. The communication chip 11H is disposed so that the receiving terminal group RXG and the transmitting terminal group TXG of the communication chip 11H are opposed to the transmitting terminal group TXG and the receiving terminal group RXG of the communication chip 11E across the thickness of memory module board 10A.

The memory system 1A includes the four communication chips 11 (11E to 11H) each including the receiving terminals rx0 to rx7 and the transmitting terminals tx0 to tx7. Each communication chip 11 according to the second embodiment includes the receiving terminals rx0 to rx7 and the transmitting terminals tx0 to tx7 that are disposed to have 180 degrees rotational symmetry with respect to each other about the virtual rotation center position CA or CB. Each communication chip 11 is disposed on either the front surface 10Aa or the back surface 10Ab of the memory module board 10A so that the receiving terminals rx0 to rx7 and the transmitting terminals tx0 to tx7 thereof are opposed to the transmitting terminals tx0 to tx7 and the receiving terminals rx0 to rx7 of either an adjacent communication chip 11 on the same surface or another communication chip 11 opposed across the thickness of the memory module board 10A.

The memory system 1A can thereby ensure the smallest length, the highest linearity, and the most equal length of connections in the ring daisy chain 13 connecting the communication chips 11E to 11H, similarly to the first embodiment. As a result, the memory system 1A enables saving of power consumption of the memory module board 10A and an increase in a communication rate and/or stabilization of communication characteristics among the communication chips 11E to 11H.

While the memory system 1A according to the second embodiment includes four communication chips 11E to 11H mounted on the memory module board 10A, the memory system 1A may be configured so that just two communication chips 11 are mounted thereon. For example, the two communication chips 11 may be mounted on the front surface 10Aa or the back surface 10Ab of the memory module board 10A so that the receiving terminals rx0 to rx7 and the transmitting terminals tx0 to tx7 of the two communication chips 11 are opposed to each other like the communication chips 11E and 11F or the communication chips 11G and 11H. Alternatively, for example, one communication chip 11 may be mounted on each of the front surface 10Aa and the back surface 10Ab of the memory module board 10A so that the receiving terminals rx0 to rx7 of one of the two communication chips 11 are opposed to the transmitting terminals tx0 to tx7 of the other communication chip 11 across the thickness of memory module board 10A like the communication chips 11E and 11H or the communication chips 11F and 11G.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system, comprising:
a printed circuit board;
a plurality of semiconductor devices mounted on the printed circuit board, each semiconductor device comprising a substrate and including:
a plurality of receiving terminals on a surface of the substrate; and
a plurality of transmitting terminals on the surface of the substrate,
the plurality of transmitting terminals being symmetrically positioned on the surface of the substrate with respect to the plurality of receiving terminals with at least a 90 degree rotation about a rotation center position, an ordering of the plurality of transmitting terminals along the surface of the substrate from the rotation center position matching an ordering of the plurality of receiving terminals along the surface of the substrate from the rotation center position; and
a plurality of memory devices, each memory device being connected to one of the semiconductor devices, wherein
the plurality of semiconductor devices are disposed on the printed circuit board so that the respective plurality of receiving terminals of each of the semiconductor devices are opposed to the plurality of transmitting terminals of another one of the semiconductor devices and each of the semiconductor devices are connected to each of the other semiconductor devices on the printed circuit board in a ring daisy chain.

2. The memory system according to claim 1, wherein the plurality of semiconductor devices are mounted on a same surface of the printed circuit board.

3. The memory system according to claim 1, wherein pairs of the plurality of semiconductor devices are mounted on opposite surfaces of the printed circuit board.

4. The memory system according to claim 1, wherein the plurality of transmitting terminals are symmetrically positioned on the surface of the substrate with respect to the plurality of receiving terminals with substantially a 90 degree rotation about the rotation center position.

5. The memory system according to claim 1, wherein the plurality of transmitting terminals are symmetrically positioned on the surface of the substrate with respect to the plurality of receiving terminals with substantially a 180 degree rotation about the rotation center position.

6. The memory system according to claim 1, wherein each semiconductor device includes an external terminal group for connecting to a host device.

7. The memory system according to claim 1, wherein at least one semiconductor device includes an external terminal group for connecting to a host device.

8. The memory system according to claim 1, wherein the memory devices are NAND memories.

9. The memory system according to claim 6, wherein the external terminal group comprises a transmission terminal group connected to the host device.

10. The memory system according to claim 7, wherein the external group comprises a transmission terminal group connected to the host device.

11. A memory system, comprising:
a printed circuit board having a first surface side;
a first semiconductor device mounted on the first surface side of the printed circuit board;
a second semiconductor device mounted on the first surface side of the printed circuit board;
a third semiconductor device mounted on the first surface side of the printed circuit board;
a fourth semiconductor device mounted on the first surface side of the printed circuit board; and
a plurality of memory devices, each memory device being connected to one of the first through fourth semiconductor devices, wherein
each of the first through fourth semiconductor devices have a plurality of receiving terminals and a plurality of transmitting terminals symmetrically positioned with respect to the plurality of receiving terminals at a 90 degree rotation about a rotation center position,
the plurality of transmitting terminals of the first semiconductor device are adjacent and connected to the plurality of receiving terminals of the second semiconductor device,
the plurality of transmitting terminals of the second semiconductor device are adjacent and connected to the plurality of receiving terminals of the third semiconductor device,
the plurality of transmitting terminals of the third semiconductor device are adjacent and connected to the plurality of receiving terminals of the fourth semiconductor device, and
the plurality of transmitting terminals of the fourth semiconductor device are adjacent and connected to the plurality of receiving terminals of the first semiconductor device.

12. The memory system according to claim 11, wherein the memory devices are NAND memories.

13. The memory system according to claim 11, wherein the first semiconductor device includes an external receiving terminal group for connecting to a host device.

14. The memory system according to claim 11, wherein at least one of the first through fourth semiconductor devices includes an external terminal group for connecting to a host device.

15. A memory system, comprising:
a printed circuit board having a first surface side and a second surface side opposite the first surface side;
a first semiconductor device mounted on the first surface side of the printed circuit board;
a second semiconductor device mounted on the first surface side of the printed circuit board;
a third semiconductor device mounted on the second surface side of the printed circuit board;
a fourth semiconductor device mounted on the second surface side of the printed circuit board; and
a plurality of memory devices, each memory device being connected to one of the first through fourth semiconductor devices, wherein
each of the first through fourth semiconductor devices have a plurality of receiving terminals and a plurality of transmitting terminals symmetrically positioned with respect to the plurality of receiving terminals at a 180 degree rotation about a rotation center position,
the plurality of transmitting terminals of the first semiconductor device are adjacent and connected to the plurality of receiving terminals of the second semiconductor device,
the plurality of transmitting terminals of the second semiconductor device are connected to the plurality of receiving terminals of the third semiconductor device through a thickness of the printed circuit board,
the plurality of transmitting terminals of the third semiconductor device are adjacent and connected to the plurality of receiving terminals of the fourth semiconductor device, and
the plurality of transmitting terminals of the fourth semiconductor device are connected to the plurality of receiving terminals of the first semiconductor device through the thickness of the printed circuit board.

16. The memory system according to claim 15, wherein the memory devices are NAND memories.

17. The memory system according to claim 15, wherein the first semiconductor device includes an external receiving terminal group for connecting to a host device.

18. The memory system according to claim 15, wherein at least one of the first through fourth semiconductor devices includes an external terminal group for connecting to a host device.

* * * * *